United States Patent
Badger et al.

(10) Patent No.: US 7,742,632 B2
(45) Date of Patent: Jun. 22, 2010

(54) ALTERNATING PHASE SHIFT MASK INSPECTION USING BIASED INSPECTION DATA

(75) Inventors: Karen D. Badger, Georgia, VT (US); Michael S. Hibbs, Westford, VT (US); Christopher K. Magg, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 922 days.

(21) Appl. No.: 11/549,263

(22) Filed: Oct. 13, 2006

(65) Prior Publication Data

US 2008/0089575 A1    Apr. 17, 2008

(51) Int. Cl.
 *G06K 9/00* (2006.01)
(52) U.S. Cl. ..................................... 382/144
(58) Field of Classification Search ................. 382/144, 382/145, 149; 438/16; 716/19, 21
See application file for complete search history.

(56) References Cited

U.S. PATENT DOCUMENTS

| | | | |
|---|---|---|---|
| 4,809,341 A * | 2/1989 | Matsui et al. ............... | 382/144 |
| 5,481,624 A * | 1/1996 | Kamon ........................ | 382/144 |
| 5,563,702 A | 10/1996 | Emery et al. | |
| 5,744,381 A * | 4/1998 | Tabata et al. .................. | 438/16 |
| 6,400,838 B2 * | 6/2002 | Watanabe .................... | 382/144 |
| 6,625,800 B1 | 9/2003 | Qian et al. | |
| 6,836,560 B2 | 12/2004 | Emery | |
| 6,850,321 B1 | 2/2005 | Yu | |
| 7,027,635 B1 * | 4/2006 | Wihl et al. ................... | 382/144 |
| 2002/0028391 A1 * | 3/2002 | Nakao ........................... | 430/5 |
| 2002/0186879 A1 | 12/2002 | Hemar et al. | |
| 2003/0161525 A1 * | 8/2003 | Bruce et al. .................. | 382/149 |
| 2005/0134840 A1 | 6/2005 | Yu | |
| 2005/0198609 A1 | 9/2005 | Hwang et al. | |
| 2007/0280527 A1 * | 12/2007 | Almogy et al. .............. | 382/149 |

* cited by examiner

*Primary Examiner*—Jon Chang
(74) *Attorney, Agent, or Firm*—Richard Kotulak; Hoffman Warnick LLC (57) ABSTRACT

An inspection system uses inspection data biased to compensate for mismatches that occur as a result of using an optical lithography system to print an alternating phase shift mask that operates at a wavelength of light that is different from the wavelength of light that an inspection system uses to inspect the mask for defects.

17 Claims, 5 Drawing Sheets

ALTERNATING PHASE SHIFT MASK INSPECTION USING BIASED INSPECTION DATA

BACKGROUND OF THE DISCLOSURE

This disclosure generally relates to mask inspection, and more specifically to inspecting an alternating phase shift mask using biased inspection data.

Currently, state of the art semiconductor manufacturing utilizes 193 nm wavelength optical lithography systems in conjunction with phase shift masks such as alternating phase shift masks to create circuit patterns. A problem that alternating phase shift mask manufacturers face is that currently available mask inspection tools used to find defects in the masks after fabrication utilize a non-actinic wavelength of light which does not match with the 193 nm wavelength optical lithography systems. When there is a mismatch between the wavelength of light used to expose an alternating phase shift mask and the wavelength of light used to inspect the mask, a die-to-database inspection methodology will generate a very high number of false defect detections when inspecting an alternating phase shift mask. A die-to-database inspection methodology, which compares images taken from the alternating phase shift mask to images of the design data used to fabricate the mask, will generate a high number of false detection of defects because the images observed for the unetched (0 degree regions) and etched regions (180 degree phase shift) of the mask will differ from the size of the stored images of the design data due to the variation in the wavelength of light used to expose the mask during circuit fabrication and that used to inspect the mask during mask fabrication. With such a high rate of false detection of defects, mask manufacturers typically have to reduce the sensitivity of the inspection of the alternating phase shift mask to quartz defects (etched regions).

These mismatch problems are not limited solely to situations when a mask is exposed on 193 nm wavelength optical lithography systems, but are inherent in any situation where the wavelength of light used to expose the alternating phase shift mask in the circuit fabrication process is different from the wavelength used to inspect the alternating phase shift mask during its fabrication process.

One way to avoid the mismatch problems is to use a die-to-die inspection methodology which compares two identical images on the mask having the same pattern and identifies any discrepancies between the two. In this methodology, the difference in the wavelength of light used to expose the mask during circuit fabrication and that used during mask inspection is not an issue because the die-to-die inspection is based only on the wavelength of light used to inspect the mask during its fabrication. Unfortunately, a die-to-die inspection methodology is not practical because many of today's alternating phase shift mask designs are too large to have a copy of the design on the same mask.

SUMMARY

Therefore, there is a need for an approach that can accommodate a die-to-database inspection methodology for alternating phase shift masks exposed with a wavelength of light that is different from the wavelength of light used to inspect the masks during mask fabrication.

In one embodiment, there is a system for inspecting an alternating phase shift mask. In this embodiment, the system comprises an optical scanner configured to scan the alternating phase shift mask and generate optical image data. A database is configured to store inspection data biased to compensate for the optical scanning response of the alternating phase shift mask with the optical scanner. An image processor is configured to determine if a defect is present in the alternating phase shift mask. The image processor determines the presence of a defect by comparing the generated optical image data to the biased inspection data. A variation between the generated optical image data and the biased inspection data that exceeds a user selectable threshold is indicative of a defect in the alternating phase shift mask.

In another embodiment, there is a method for inspecting an alternating phase shift mask. In this embodiment, the alternating phase shift mask is scanned with an optical scanner. The method further comprises generating optical image data from the scan of the alternating phase shift mask. The method also comprises retrieving inspection data biased to compensate for the optical scanning response of the alternating phase shift mask with the optical scanner. The method further comprises determining if a defect is present in the alternating phase shift mask in accordance with the generated optical image data and the biased inspection data.

In a third embodiment, there is a computer-readable medium storing computer instructions for enabling an optical inspection system to determine a defect in an alternating phase shift mask. In this embodiment, the computer instructions comprise obtaining optical image data of the alternating phase shift mask generated from an optical scanner. The computer instructions further comprise retrieving inspection data biased to compensate for the optical scanning response of the alternating phase shift mask with the optical scanner. The computer instructions further comprise determining if a defect is present in the alternating phase shift mask in accordance with the generated optical image data and the biased inspection data.

In yet another embodiment, there is a method for deploying an inspection tool for use in a computer system that enables inspection of an alternating phase shift mask. In this embodiment, a computer infrastructure is provided and is operable to obtain optical image data of the alternating phase shift mask generated from an optical scanner; retrieve inspection data biased to compensate for the optical scanning response of the alternating phase shift mask with the optical scanner; and determine if a defect is present in the alternating phase shift mask in accordance with the generated optical image data and the biased inspection data.

Therefore, this disclosure provides a method, system, and program product for deploying an application for using an inspection tool in a computer system to inspect an alternating phase shift mask.

DETAILED DESCRIPTION

Figure 1:
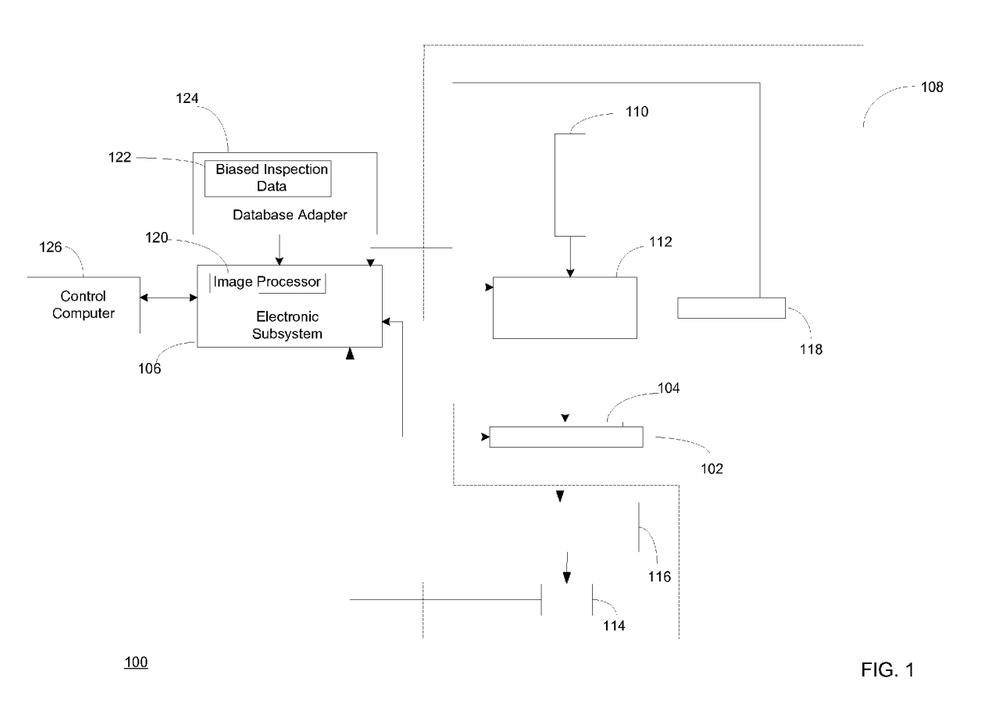
FIG. 1 shows a simplified schematic of a mask inspection system for inspecting an alternating phase shift mask.

FIG. 1 shows a simplified schematic of a mask inspection system 100 for inspecting an alternating phase shift mask. Besides conventional alternating phase shift masks, the following description of the mask inspection system 100 is suitable for use with other types of masks such as binary and attenuated phase shift masks. The mask inspection system 100 can perform several types of inspection operations for detecting defects such as transmitted light inspection, reflected light inspection, and simultaneous reflected and transmitted inspection. In transmitted light inspection, light impinges on a substrate and the inspection system 100 detects the amount of light transmitted through the mask. In reflected light inspection, the inspection system 100 measures the light reflecting from a surface of the substrate under test. Simultaneous reflected and transmitted inspection performs both reflected light inspection and transmitted light inspection simultaneously.

Referring back to FIG. 1, the mask inspection system 100 includes a stage 102 for carrying a substrate (i.e., the alternating phase shift mask) 104 that is to undergo inspection. The stage 102 is a precision device driver under control of an electronic subsystem 106 that is capable of moving the mask 104 under test in a serpentine fashion, within a single plane, relative to the optical axes of an optical subsystem 108 so that all or any selected part of the mask surface may be inspected. The optical subsystem 108 is essentially a laser scanner apparatus that includes a light source 110 and a first set of associated optics 112 which deflect a beam of coherent light over a small angle under the control of the electronic subsystem 106. The beam sweep is in a direction such that, after passing through the optical subsystem 108, it is directed parallel to the Y-axis as viewed at the mask 104. As the beam is swept, the stage 102 carrying the mask 104 under test moves back and forth in the direction of the X-axis, being incremented in the Y-direction at the end of each traverse so that the beam sweeps along a serpentine path across a plurality of identified mask sub-areas. In this manner the entire surface area of the mask 104 is swept in a series of contiguous swaths by the laser beam. In the case of a transparent or partially transparent mask, a transmission detector 114 will detect the image as the beam passes through a second set of associated optics 116. In the case of a reflective or partially reflective mask, a reflected light detector 118 will detect the light reflected from the mask via the first set of associated optics 112.

As shown in FIG. 1, the electronic subsystem 106 comprises an image processor 120 that receives optical image data from the transmission detector 114 and the reflected light detector 118. The image processor 120 uses a die-to-database inspection methodology to determine the presence of defects in the alternating phase shift mask. In particular, the image processor 120 retrieves biased inspection data 122 stored in a database adapter 124 and compares the observed optical image data generated from the transmission detector 114 and the reflected light detector 118 to the biased inspection data. If there is a variation between the observed optical image data and the bias inspection data 122 that exceeds a user selectable threshold, then the image processor 120 determines that a defect is present.

The biased inspection data 122 is data that has been biased to compensate for the optical scanning response of the alternating phase shift mask with the optical scanner. As mentioned above, mismatches that result from using a mask inspection system that operates at a wavelength of light different from the wavelength of light used to expose an alternating phase shift mask lead to a very high amount of false defect detections. With inspection data biased to compensate for the difference in the optical scanning response of the mask with the scanner and the system used to expose the mask, there will not be so much of a variation in the size of the optical images when comparing observed optical image data to biased inspection data. As a result, the inspection system 100 can be run at a higher sensitivity. Below is a more detailed discussion on how to generate the biased inspection data 122 for the optical subsystem 108.

The image processor 120 can take the form of an entirely hardware embodiment, an entirely software embodiment or an embodiment containing both hardware and software elements. In a preferred embodiment, the processing functions performed by the image processor 120 are implemented in software, which includes but is not limited to firmware, resident software, microcode, etc.

Furthermore, the processing functions performed by the image processor 120 can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be any apparatus that can contain, store, communicate, propagate, or transport the program containing the instructions for performing the image processing functions for use by or in connection with an instruction execution system, apparatus, or device. The computer readable medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include a compact disk—read only memory (CD-ROM), a compact disk—read/write (CD-R/W) and a digital video disc (DVD).

The electronic subsystem 106 performs additional functions besides performing the image processing operations used to inspect the alternating phase shift mask for defects. For instance, the electronics subsystem 106 interprets and executes commands issued by a control computer 126 that acts as a master controller of the inspection system 100. A non-exhaustive list of these commands may include functions such as digitizing the input from detectors 114 and 118, compensating these readings for variations in the incident light intensity, monitoring the tracking of the stage 102 during inspection and providing the drive for motors used to move the stage 102.

In one embodiment, the database adapter 124 comprises a database configured to store the biased inspection data 122 for use in die-to-database inspection methodologies. Besides storing the biased inspection data 122, the database adapter 124 can store other alternating phase shift mask information such as reference or design data and pattern and feature data associated with the mask. In addition, the database adapter 124 can store the location of any defects detected in the mask. One of ordinary skill in the art will recognize that there are a variety of other data that the database adapter 124 can store in addition to the examples listed above.

In addition to acting as the master controller of the inspection system 100, the control computer 126 acts as the operator console of the system. Therefore, in one embodiment, the control computer 126 may issue commands to control the operation of the inspection system 100 and monitor the status of the optical subsystem 108 and electrical subsystem 106. Although not shown in FIG. 1, the control computer 126 may comprise an input device such as a keyboard to accept operator inputs, a database to store information and a display to monitor results from the operation of the inspection system such as defects noted in the alternating phase shift mask and the status of the subsystems. In one embodiment, the control computer 126 is a general-purpose computer that can take the form of a workstation, however, other types of computers can be used.

Figure 2:
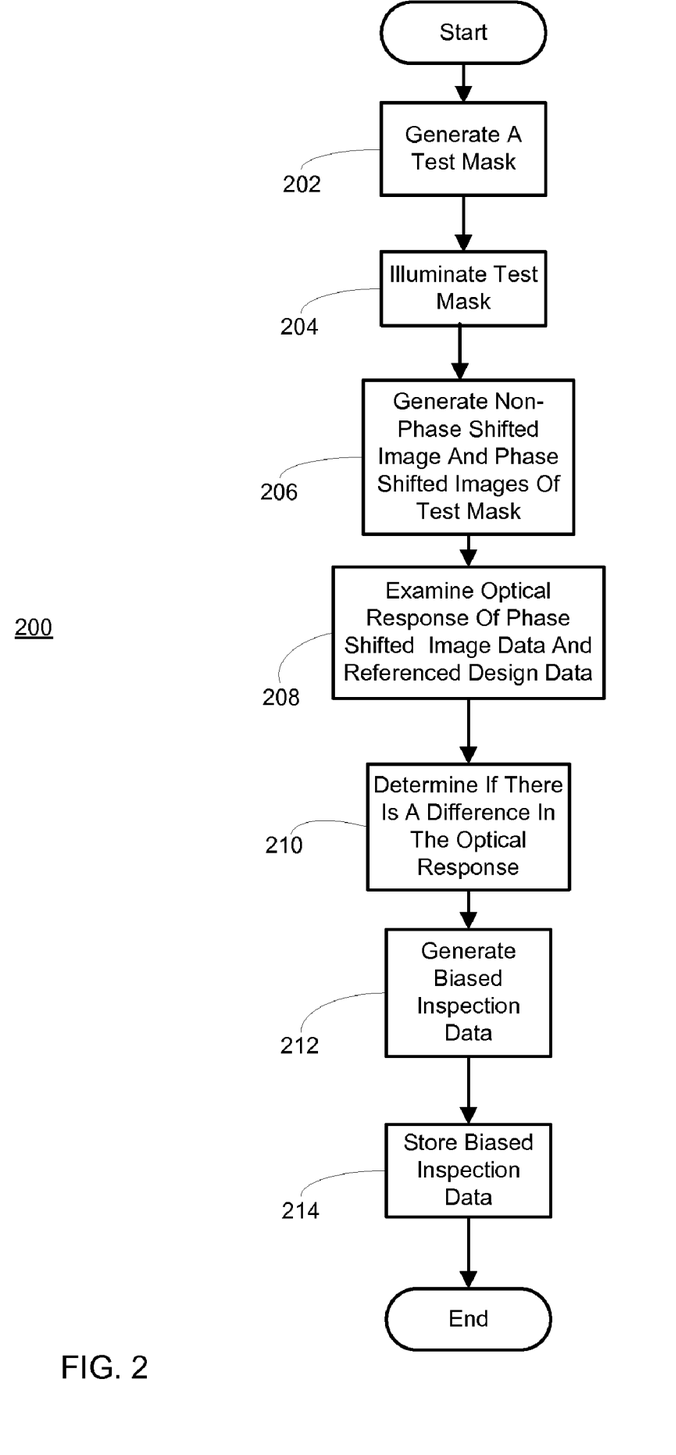
FIG. 2 shows a flow chart describing the generation of biased inspection data for use with the system depicted in FIG. 1.

FIG. 2 shows a flow chart 200 describing the generation of biased inspection data for use with the system depicted in FIG. 1. The generation of biased inspection data begins by generating a test mask of an alternating phase shift mask at 202. The test mask will have a number of repeating patterns on it. In one embodiment, there is one set of patterns that comprise lines and spaces and another set that have the exact pattern of lines and spaces, but in an alternating design. The first set of patterns of lines is referred to as 0° image data because the chrome features of the alternating phase shift test mask is etched, while the quartz features are not etched. The second set of patterns of lines is referred to as 180° image data because the chrome features of the alternating phase shift test mask are not etched, while the alternating spaced quartz features are etched.

The generation of biased inspection data continues at 204 where the inspection system that will be used to perform defect detection illuminates the test mask at its operating wavelength of light. In one embodiment, the inspection system will operate at a non-actinic wavelength of light. The inspection system will generate non-phased shifted image data (i.e., 0° image data) and phase shifted image data (i.e., 180° image data) at 206. Next, the optical responses of the non-phased shifted image data and the phase shifted image data are examined at 208. The optical response for the non-phased shifted image data is used for calibration of the database adapter, while the optical response of the phase shifted image data is used to determine a bias for inspection. In particular, the width of the lines in the phase shifted image data is examined to determine how much of a difference there is between the width of the lines for the optical image data of the design data used to fabricate the test mask, which is stored in the database adapter 108. If there is a difference in the optical response between the width of the lines for the observed optical image data and the reference design data, then the magnitude of the difference is measured at 210.

After the magnitude of the difference in optical response has been determined, it is used at 212 to generate the biased inspection data. In particular, the difference is fed back into the design data that was used to fabricate the alternating phase shift mask and that is stored in the database adapter. The design data is then adjusted according to the bias so that the image size of data obtained from the inspection system will match the optical response of the optical lithography system used to expose the alternating phase shift mask. The adjustment occurs by using a fracturing process that is a well known process that converts incoming design data from a designer's format into a format that can be used by the mask manufacturer to print and inspect the mask. The biased design data is then stored in the database adapter at 214 as biased inspection data available for use in a die-to-database inspection methodology.

Figure 3A:
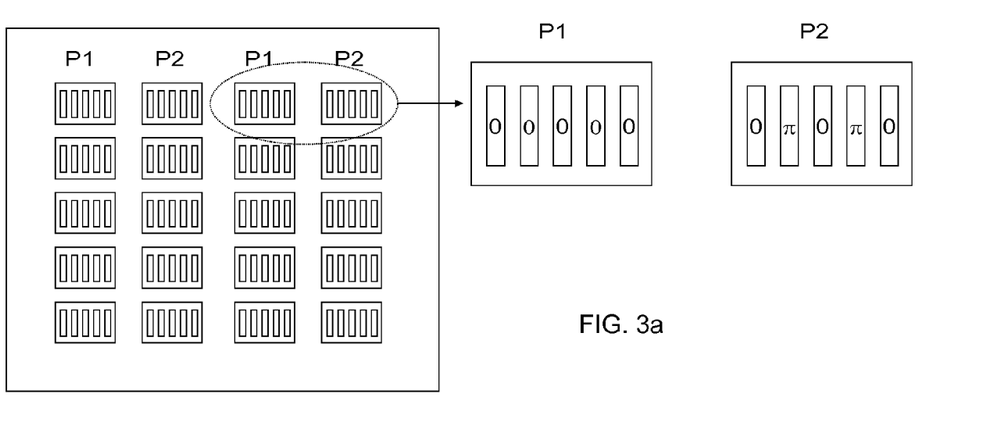
FIGS. 3a-3b show examples of an alternating phase shift mask used in a test mask to generate the biased inspection data described in FIG. 2.
Figure 3B:
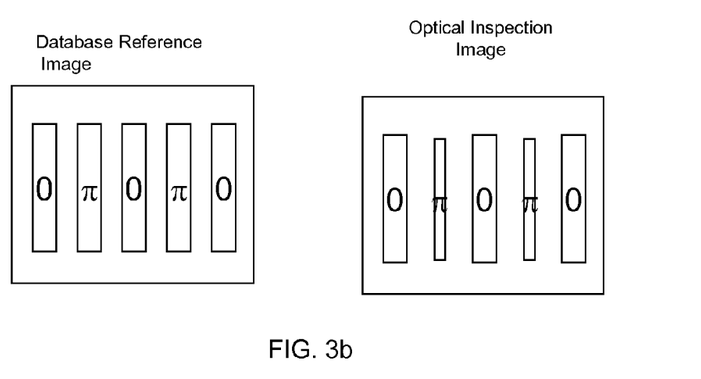

FIGS. 3a-3b show examples of an alternating phase shift mask used in a test mask to generate the biased inspection data described in FIG. 2. In particular, FIG. 3a shows a test mask with the two sets of patterns for 0° image data and 180° image data. In FIG. 3a, pattern P1 is indicative of the 0° image data because the quartz features of the mask are not etched, while pattern P2 is indicative of the 180° image data because the quartz features of the mask are etched. Areas where the quartz features of pattern P2 are etched are indicated by the reference element π. FIG. 3b shows optical image data of pattern P2 of the test mask after exposure of the mask with an optical lithography system and after inspection with the inspection system. As shown in FIG. 3b, there is a difference in the size of the width for the π features for the optical image data taken after exposure of the mask during circuit fabrication and mask inspection. In particular, the width of the π features for the optical image data taken during inspection is substantially smaller than the width of the π features for the optical image data taken during exposure of the mask. As mentioned above, the difference in the size of the width is the result of having a mismatch in the wavelength of light used to expose the mask as opposed to the wavelength of light to inspect the mask. In this disclosure, the measured difference between P1 and P2 is the value that is fed back and used to adjust the size of the π images in the design data, thus resulting in the biased inspection data. Biasing the design data to compensate for this mismatch of the operating wavelength of light will remove the image size discrepancies and enable a die-to-database inspection methodology to more accurately detect defects.

Figure 4:
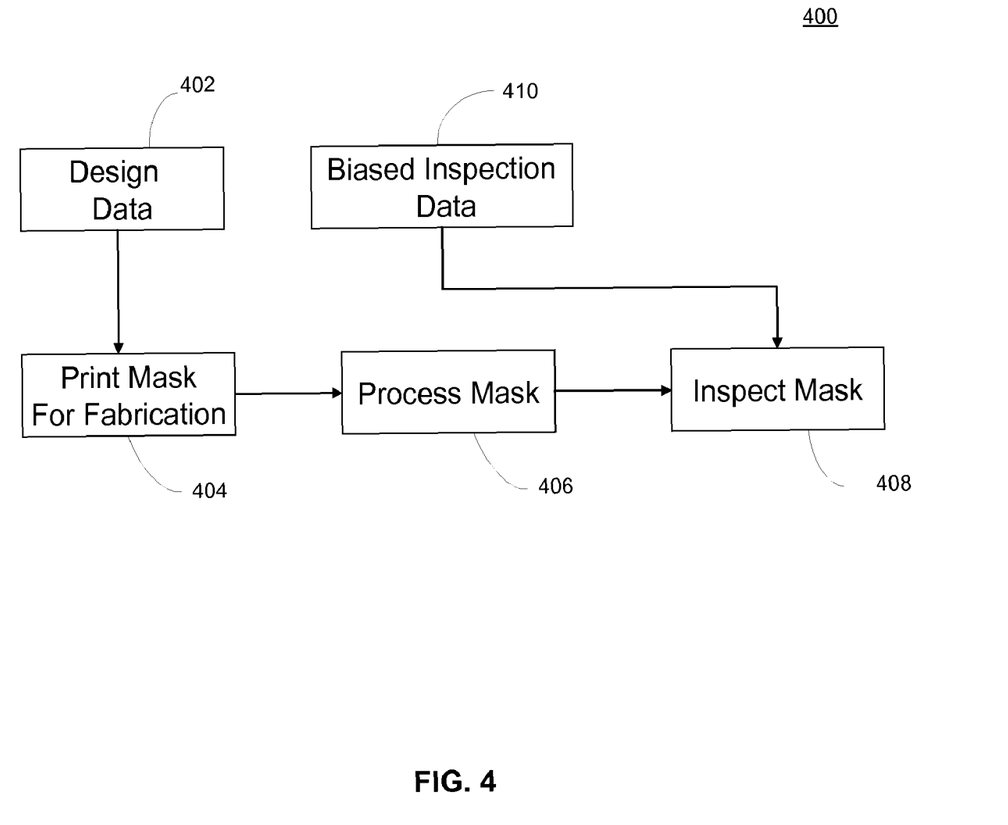
FIG. 4 shows a generalized diagram describing a process of using design data to fabricate an alternating phase shift mask and biased inspection data to inspect the mask for defects.

FIG. 4 shows a generalized diagram describing a process 400 of using design data to expose an alternating phase shift mask and biased inspection data (derived from applying a bias to the design data) used to inspect the fabricated mask for defects. In FIG. 4, the design data 402, which is the actual design that the mask manufacturer wants to fabricate is used by a mask writer at 404 to print the mask. With the alternating phase shift mask printed according to the design data it then undergoes additional mask processing operations at 406 such as developing, etching and cleaning. The inspection system then inspects the fabricated alternating phase shift mask at 408 using biased inspection data 410. The process of FIG. 4 differs from a conventional inspection process in that the inspection system of this disclosure uses biased inspection data to inspect the mask as opposed to design data. More specifically, the conventional inspection process uses the design data to both print the mask and then later to inspect the mask in a die-to-database methodology. As a result, this type of inspection process will have a high rate of false detection of defects when there is a mismatch in the operating wavelength of light used to print and inspect the mask. The inspection process of this disclosure still uses the design data for fabrication but overcomes the mismatch problems by utilizing the biased inspection data for defect inspection.

As long as the alternating phase shift mask exposure process and optical inspection system remained fixed then the bias generated in FIG. 2 can be used in the inspection of later developed alternating phase shift masks. This allows mask manufacturers to have a seamless manufacturing flow. If the mask exposure process changes or a different inspection tool is used, then one will have to generate new biased inspection data and inspect the mask for defects according to the biased data.

Figure 5:
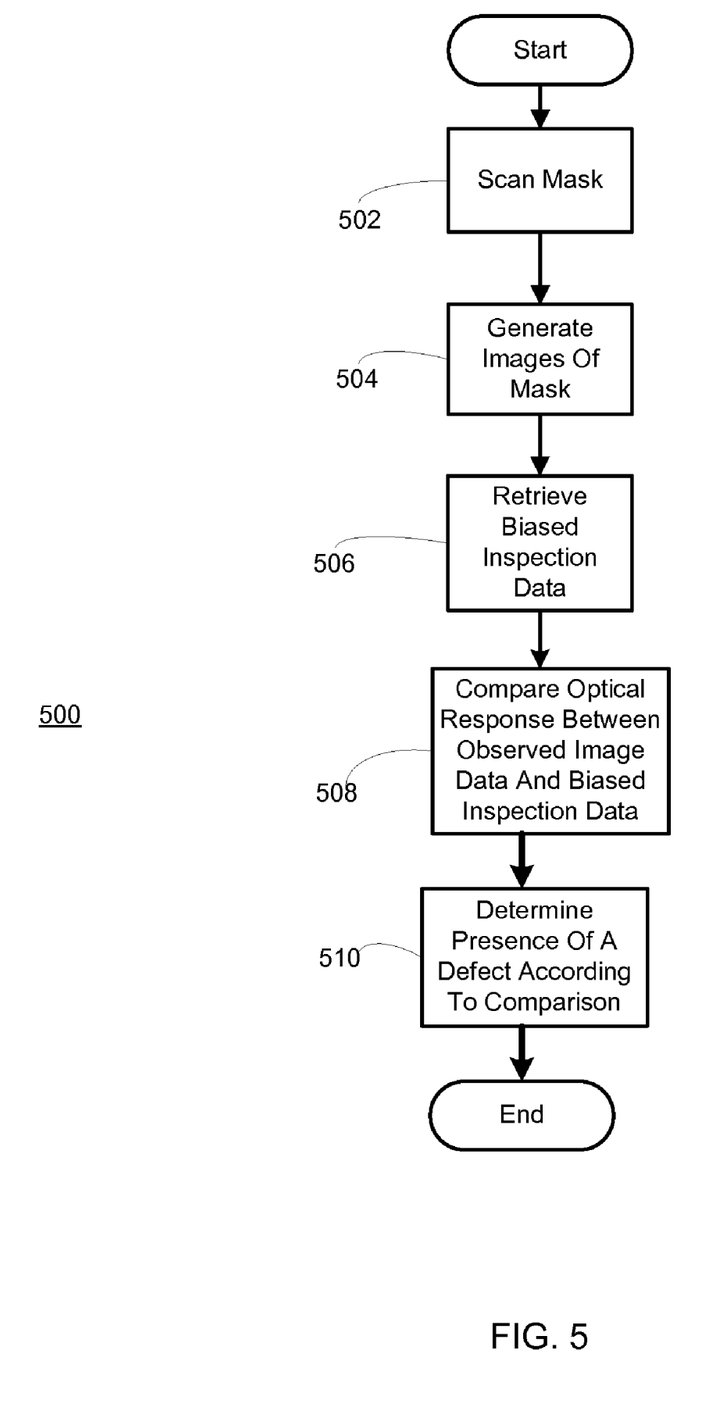
FIG. 5 shows a flow chart describing an inspection process of an alternating phase shift mask with the system depicted in FIG. 1.

FIG. 5 shows a flow chart describing an inspection process 500 of an alternating phase shift mask with the system depicted in FIG. 1. The inspection process begins by scanning an alternating phase shift mask at 502 with the inspection system depicted in FIG. 1. The inspection system generates optical images of the mask pattern at 504. The inspection system then retrieves the biased inspection data stored in the database adapter at 506. The optical inspection system then compares the optical response between the observed image data and the biased inspection data at 508. Based on the comparison the inspection system determines if a defect is present at 510. In particular, the inspection system determines that a defect is present if there is a variation between the observed optical image data and the biased inspection data that exceeds a user selectable threshold.

The foregoing flow charts of FIGS. 2, 4 and 5 show some of the processing acts associated with generating the biased inspection data, exposing an alternating phase shift mask and inspecting the mask for defects. In this regard, each block in the flow charts represents a process act associated with performing these functions. It should also be noted that in some alternative implementations, the acts noted in the blocks may occur out of the order noted in the figure or, for example, may in fact be executed substantially concurrently or in the reverse order, depending upon the act involved. Also, one of ordinary skill in the art will recognize that additional blocks that describe these processing acts may be added.

It is apparent that there has been provided with this disclosure, an approach for inspecting an alternating phased shift mask using biased inspection data. The use of biased inspection data reduces the amount of false or nuisance defects that occur as a result of the mismatch of using an optical lithography system operating at a wavelength of light that is different from the wavelength of light used to inspect the mask. As a result, an inspection system used to inspect the alternating phased shift mask can run at nearly full sensitivity for the detection of quartz defects. While the disclosure has been particularly shown and described in conjunction with a preferred embodiment thereof, it will be appreciated that a person of ordinary skill in the art can effect variations and modifications without departing from the scope of the disclosure.

In another embodiment, this disclosure provides a business method that performs the process steps of the invention on a subscription, advertising, and/or fee basis. That is, a service provider could offer to provide an inspection tool for facilitating inspection of an alternating phase shift mask. In this case, the service provider can create, deploy, maintain, support, etc., a computer infrastructure that initiates the process steps of the invention for one or more customers. In return, the service provider can receive payment from the customer(s) under a subscription and/or fee agreement and/or the service provider can receive payment from the sale of advertising content to one or more third parties.

In still another embodiment, this disclosure provides a method for using an inspection tool within a computer system to inspect an alternating phase shift mask. In this case, a framework can be provided and one or more systems for performing the process steps of the disclosure can be obtained and deployed to the framework. To this extent, the deployment of a system can comprise one or more of (1) installing program code on a computing device, such as a computer system, from a computer-readable medium; (2) adding one or more computing devices to the framework; and (3) incorporating and/or modifying one or more existing systems of the framework to enable the framework to perform the process steps of the invention.

What is claimed is:

1. A system for inspecting an alternating phase shift mask, comprising:
   an optical scanner configured to scan the alternating phase shift mask and generate optical image data;
   a database configured to store inspection data biased to compensate for the optical scanning response of the alternating phase shift mask with the optical scanner, wherein the biased inspection data is based on data derived from optical imaging data obtained from the optical scanner during a scan of a test alternating phase shift mask; and
   an image processor configured to determine if a defect is present in the alternating phase shift mask, wherein the image processor determines the presence of a defect by comparing the generated optical image data to the biased inspection data, wherein a variation between the generated optical image data and the biased inspection data that exceeds a user selectable threshold is indicative of a defect in the alternating phase shift mask.

2. The system according to claim 1, wherein the biased inspection data is based on a difference in the optical scanning response of the phase shifted optical imaging data observed by the optical scanner and reference optical image data generated from design data.

3. The system according to claim 1, wherein the optical scanner utilizes a wavelength of light that is a mismatch with wavelength light used to expose the alternating phase shift mask during fabrication.

4. The system according to claim 3, wherein the optical scanner utilizes a non-actinic wavelength of light.

5. The system according to claim 1, wherein the image processor utilizes a die-to-database inspection methodology.

6. The system according to claim 1, further comprising a controller for controlling operation of the image processor.

7. A method for inspecting an alternating phase shift mask, comprising:
   scanning the alternating phase shift mask with an optical scanner;
   generating optical image data from the scan of the alternating phase shift mask;
   retrieving inspection data biased to compensate for the optical scanning response of the alternating phase shift mask with the optical scanner, wherein the biased inspection data is based on data derived from phase shifted optical imaging data obtained from the optical scanner during a scan of a test alternating phase shift mask; and
   determining if a defect is present in the alternating phase shift mask in accordance with the generated optical image data and the biased inspection data.

8. The method according to claim 7, wherein the determining of the presence of a defect comprises comparing the generated optical image data to the biased inspection data, wherein a variation between the generated optical image data and the biased inspection data that exceeds a user selectable threshold is indicative of a defect in the alternating phase shift mask.

9. The method according to claim 7, wherein the biased inspection data is based on a difference in the optical scanning response of the phase shifted optical imaging data observed by the optical scanner and reference optical image data generated from design data.

10. The method according to claim 7, wherein the scanning utilizes a wavelength of light that is a mismatch with wavelength light used to expose the alternating phase shift mask during fabrication.

11. The method according to claim 10, wherein the scanning utilizes a non-actinic wavelength of light.

12. The method according to claim 7, wherein the determining comprises utilizing a die-to-database inspection methodology.

13. A computer-readable storage medium storing computer instructions for enabling an optical inspection system to determine a defect in an alternating phase shift mask, the computer instructions comprising:

obtaining optical image data of the alternating phase shift mask generated from an optical scanner;

retrieving inspection data biased to compensate for the optical scanning response of the alternating phase shift mask with the optical scanner, wherein the retrieved biased inspection data is based on data derived from phase shifted optical imaging data obtained from the optical scanner during a scan of a test alternating phase shift mask; and determining if a defect is present in the alternating phase shift mask in accordance with the generated optical image data and the biased inspection data.

14. The computer-readable storage medium according to claim 13, wherein the determining of the presence of a defect comprises instructions for comparing the generated optical image data to the biased inspection data, wherein a variation between the generated optical image data and the biased inspection data that exceeds a user selectable threshold is indicative of a defect in the alternating phase shift mask.

15. The computer-readable storage medium according to claim 14, wherein the biased inspection data is based on a difference in the optical scanning response of the phase shifted optical imaging data observed by the optical scanner and reference optical image data generated from design data.

16. The computer-readable storage medium according to claim 13, wherein the scanning utilizes a wavelength of light that is a mismatch with wavelength light used to expose the alternating phase shift mask during fabrication.

17. The computer-readable storage medium according to claim 13, wherein the determining comprises utilizing a die-to-database inspection methodology.

\* \* \* \* \*